United States Patent
Ping et al.

(10) Patent No.: US 10,671,194 B2
(45) Date of Patent: Jun. 2, 2020

(54) TOUCH-SENSITIVE CONDUCTIVE FILM, TOUCH-SENSITIVE ASSEMBLY, TOUCH-SENSITIVE DISPLAY SCREEN AND ELECTRONIC DEVICE

(71) Applicant: KUNSHAN VISIONOX TECHNOLOGY CO., LTD., Kunshan (CN)

(72) Inventors: Kangkang Ping, Kunshan (CN); Long Wang, Kunshan (CN)

(73) Assignee: KUNSHAN VISIONOX TECHNOLOGY CO., LTD., Kunshan (CN)

( * ) Notice: Subject to any disclaimer, the term of this patent is extended or adjusted under 35 U.S.C. 154(b) by 0 days.

(21) Appl. No.: 15/781,443

(22) PCT Filed: Dec. 2, 2016

(86) PCT No.: PCT/CN2016/108390
§ 371 (c)(1),
(2) Date: Jun. 4, 2018

(87) PCT Pub. No.: WO2017/107756
PCT Pub. Date: Jun. 29, 2017

(65) Prior Publication Data
US 2018/0348928 A1 Dec. 6, 2018

(30) Foreign Application Priority Data
Dec. 24, 2015 (CN) .......................... 2015 1 0989999

(51) Int. Cl.
*G06F 3/041* (2006.01)
*G06F 3/044* (2006.01)
*H03K 17/96* (2006.01)
*H05K 1/02* (2006.01)
*H05K 1/18* (2006.01)
*H05K 3/40* (2006.01)

(52) U.S. Cl.
CPC ............ *G06F 3/0412* (2013.01); *G06F 3/044* (2013.01); *H03K 17/962* (2013.01); *H05K 1/028* (2013.01);
(Continued)

(58) Field of Classification Search
CPC ..... G06F 3/0412; G06F 3/044; H05K 3/4038; H05K 1/028; H05K 1/189; H03K 17/962; B32B 2307/202; B32B 2457/208
See application file for complete search history.

(56) References Cited

U.S. PATENT DOCUMENTS

| 2007/0291963 A1 | 12/2007 | Watanabe et al. |
| 2009/0135161 A1 | 5/2009 | Endo |

(Continued)

FOREIGN PATENT DOCUMENTS

| CN | 202976047 | 6/2013 |
| CN | 203350830 | 12/2013 |

(Continued)

OTHER PUBLICATIONS

PCT Search Report for Application No. PCT/CN2016/108390, dated Feb. 21, 2017, 3 pages.
(Continued)

*Primary Examiner* — Rodney Amadiz
(74) *Attorney, Agent, or Firm* — Seyfarth Shaw LLP

(57) ABSTRACT

A touch-sensitive conductive film, and a touch-sensitive assembly, a touch-sensitive display screen and an electronic device having the conductive film. The touch-sensitive conductive film comprises a sensing area and a key area. The key area is provided with a bonding area configured to bond a flexible circuit board, and a key. The key area is provided with a through-hole in a thickness direction of the touch-sensitive conductive film, and the through-hole is located at a side of the bonding area, so that the flexible circuit board (Continued)

is able to pass through the touch-sensitive conductive film via the through-hole. The flexible circuit board passes through the through-hole with two ends of the flexible circuit board being located at two sides of the touch-sensitive conductive film respectively, after the flexible circuit board is bonded to the touch-sensitive conductive film. In this way, the flexible circuit board would not cover the key area of the touch-sensitive conductive film, thus solving the problem that the flexible circuit board and the key interfere with each other in space, without affecting the layout design of the key. Meanwhile, an attaching surface of the touch-sensitive conductive film through which the touch-sensitive conductive film is attached onto the complete device is relatively flat, and the sealing performance of the attaching can be ensured.

10 Claims, 4 Drawing Sheets

(52) U.S. Cl.
CPC ........... *H05K 1/189* (2013.01); *H05K 3/4038* (2013.01); *B32B 2307/202* (2013.01); *B32B 2457/208* (2013.01)

(56) References Cited

U.S. PATENT DOCUMENTS

| | | | |
|---|---|---|---|
| 2014/0218629 | A1 | 8/2014 | Chuang et al. |
| 2015/0092120 | A1 | 4/2015 | Wang et al. |
| 2016/0062538 | A1* | 3/2016 | Jo .......................... G06F 3/041 345/173 |

FOREIGN PATENT DOCUMENTS

| | | |
|---|---|---|
| CN | 103984452 | 8/2014 |
| CN | 104281309 | 1/2015 |
| CN | 104516571 | 4/2015 |
| CN | 204331663 | 5/2015 |
| CN | 204808251 | 11/2015 |
| CN | 105511701 | 4/2016 |
| CN | 205334439 | 6/2016 |
| JP | 2001168546 | 6/2001 |
| JP | 2008021304 | 1/2008 |
| JP | 2009129370 A | 6/2009 |
| JP | 2011107989 | 6/2011 |
| JP | 2012247889 A | 12/2012 |
| TW | 201514787 | 4/2015 |

OTHER PUBLICATIONS

TW Search Report and First Office Action for TW Application No. 105140757, dated Nov. 6, 2017, 7 pages.
TW Search Report and Second Office Action for TW Application No. 105140757, dated Apr. 10, 2018, 7 pages.
CN Search Report and First Office Action for CN Application No. 201510989999.1, 8 pages.
JP Search Report for Japanese Application No. 2018-549384, dated Jun. 24, 2019, 7 pages.
Office Action for Japanese Patent Application No. 2018-549384 dated Jul. 30, 2019, 5 pages.

* cited by examiner 222  226  224

200
400

TOUCH-SENSITIVE CONDUCTIVE FILM, TOUCH-SENSITIVE ASSEMBLY, TOUCH-SENSITIVE DISPLAY SCREEN AND ELECTRONIC DEVICE

CROSS REFERENCE TO RELATED APPLICATIONS

This is a National Stage application of PCT/CN2016/108390, filed Dec. 2, 2016, which claims priority to Chinese Patent Application No. 201510989999.1, filed Dec. 24, 2015, the disclosures of which are incorporated herein by reference in their entirety.

FIELD

The present disclosure relates to the field of touch-sensing, and particularly to a touch-sensitive conductive film, as well as a touch-sensitive assembly, a touch-sensitive display screen and an electronic device having the touch-sensitive conductive film.

BACKGROUND

As shown in MG. 1, in a traditional structure design of a capacitive screen, a flexible circuit board 120 is drawn from a side of the capacitive screen on which a key 110 is arranged. Therefore, an area space is limited. In addition, the number of sensing channels (leads of the touch-sensitive conductive film) increases as the size of the capacitive screen increases, which results in a larger width of the flexible circuit board 120. There exists a problem that it is hard to arrange the flexible circuit board 120 and the key 110 reasonably.

Further, referring to FIG. 2, when designing the capacitive screen in a traditional way, for the convenience of bending the flexible circuit board 120, a notch 130 may be provided inward on an edge of the touch-sensitive conductive film from which the flexible circuit board 120 are drawn out. However, the notch 130 may cause the touch-sensitive conductive film to be uneven, affecting the sealing performance when the touch-sensitive conductive film is attached with the electronic device which is a complete device.

SUMMARY

Based on the above, it is necessary to provide a touch-sensitive conductive film, which can avoid the influence on the layout design of the key and the sealing performance of the attaching of the complete device from the bonding of the flexible circuit board.

According to an aspect of the present disclosure, a touch-sensitive conductive film is provided, including a sensing area and a key area. The key area is provided with a bonding area configured to bond a flexible circuit board, and a key. The key area is provided with a through-hole in a thickness direction of the touch-sensitive conductive film, and the through-hole is located at a side of the bonding area, so that the flexible circuit board is able to pass through the touch-sensitive conductive film via the through-hole.

In the above touch-sensitive conductive film, a through-hole for the flexible circuit board to pass through is arranged on a side of the bonding area, and the flexible circuit board can pass through the through-hole with two ends of the flexible circuit board being located at two sides of the touch-sensitive conductive film respectively, after the flexible circuit board is bonded to the touch-sensitive conductive film. In this way, the flexible circuit board would not cover the key area of the touch-sensitive conductive film, thus solving the problem that the flexible circuit board and the key interfere with each other in space, without affecting the layout design of the key. Meanwhile, an attaching surface of the touch-sensitive conductive film through which the touch-sensitive conductive film is attached onto the complete device is relatively flat, and the sealing performance of the attaching can be ensured.

In one embodiment, the touch-sensitive conductive film may be an indium tin oxide conductive film.

In one embodiment, a peripheral edge of the through-hole does not overlap with an edge of the touch-sensitive conductive film.

A touch-sensitive assembly is further provided, including the above touch-sensitive conductive film and a flexible circuit board. The flexible circuit board passes through the through-hole, one end of the flexible circuit board is bonded to the bonding area of the touch-sensitive conductive film, and the other end is bonded to a side of the touch-sensitive conductive film away from the bonding area.

In one embodiment, the flexible circuit board may pass through the through-hole with one end of the flexible circuit board bonded to the bonding area of the touch-sensitive conductive film, and an the other end of the flexible circuit board bonded to a side of the touch-sensitive conductive film away from the bonding area.

In one embodiment, the protective cover board may be provided with a visible area located at a center thereof and a non-visible area located at a periphery thereof, the sensing area is located on the visible area, and the key area is located on the non-visible area.

In one embodiment, the flexible circuit board may be bent in a direction away from the key area after passing through the through-hole.

In one embodiment, a width of the through-hole may be consistent with a thickness of the flexible circuit board.

According to another aspect of the present disclosure, a touch-sensitive display screen is provided, including a display screen and the above touch-sensitive assembly. The touch-sensitive conductive film of the touch-sensitive assembly is attached together with the display screen.

According to a further aspect of the present disclosure, an electronic device is provided, including the above touch-sensitive display screen.

DETAILED DESCRIPTION OF THE PREFERRED EMBODIMENTS

In the following description of embodiments, reference is made to the accompanying drawings which form a part hereof, and in which it is shown by way of illustration specific embodiments of the disclosure that can be practiced. It is to be understood that other embodiments can be used and structural changes can be made without departing from the scope of the disclosed embodiments.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached or coupled to the other feature or element or intervening features or elements may be present.

Unless otherwise defined, all technical and scientific terms used herein have the same meaning as commonly understood by one of ordinary skill in the art to which this invention belongs. Terminology used herein is for the purpose of describing particular embodiments only and is not intended to limit the present disclosure. The term "and/or" as used herein includes any and all combinations of one or more of the associated listed items.

The preferred embodiments of the disclosure will now be described in detail with reference to the accompany drawings.

Figure 1:
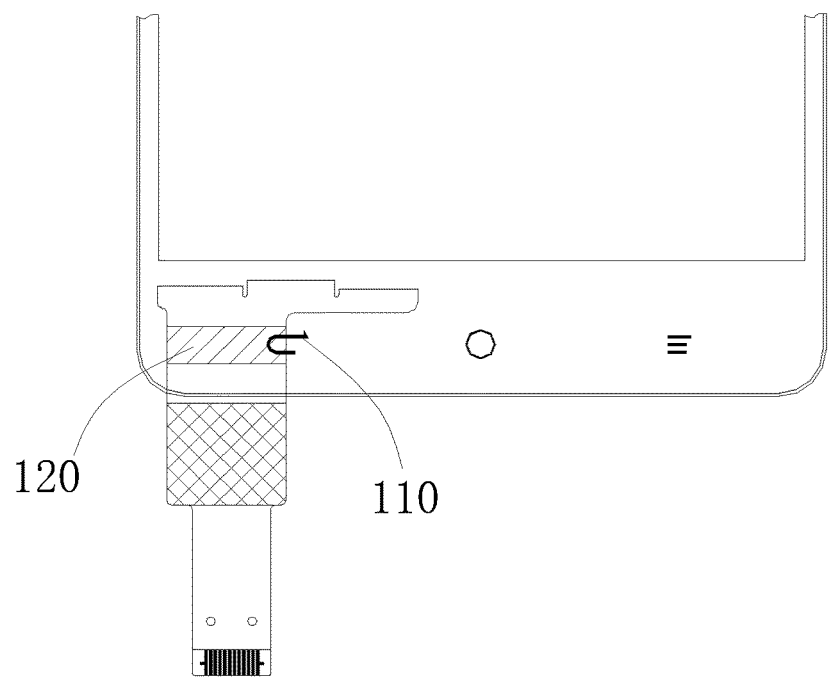
FIG. 1 is a schematic diagram illustrating a connection between a flexible circuit board and a conductive film in a traditional touch-sensitive display screen.
Figure 2:
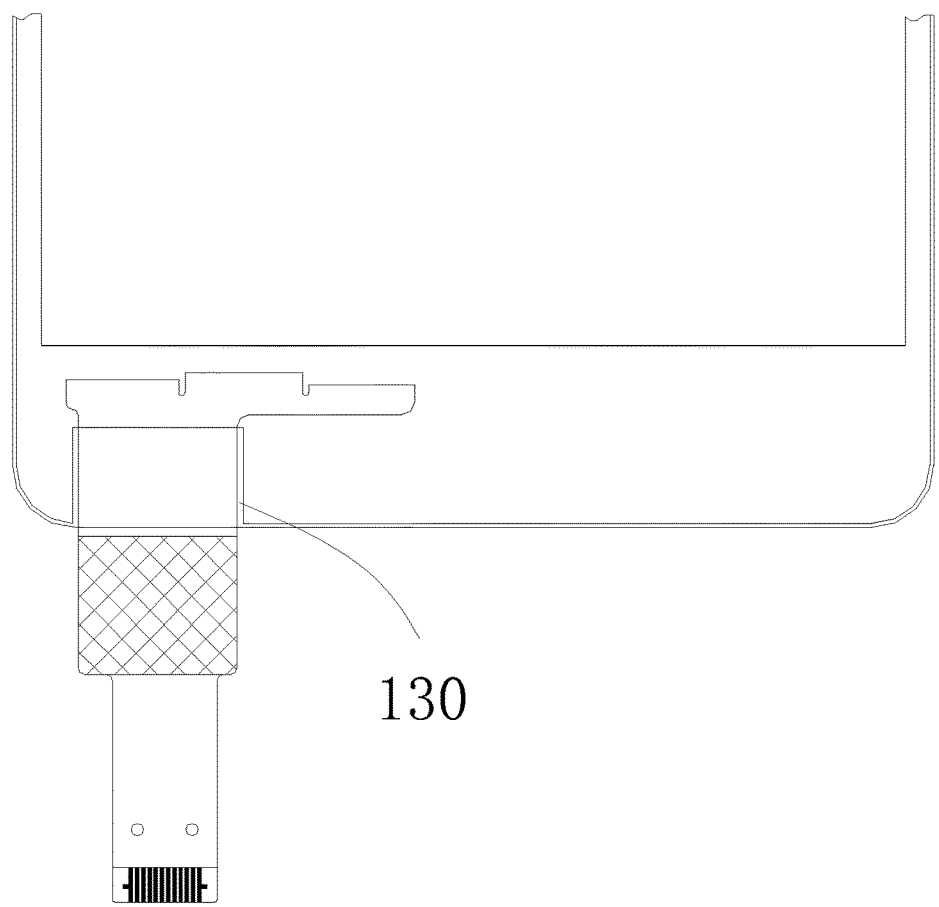
FIG. 2 is a schematic diagram illustrating a notch provided on the conductive film of the traditional touch-sensitive display screen.
Figure 3:
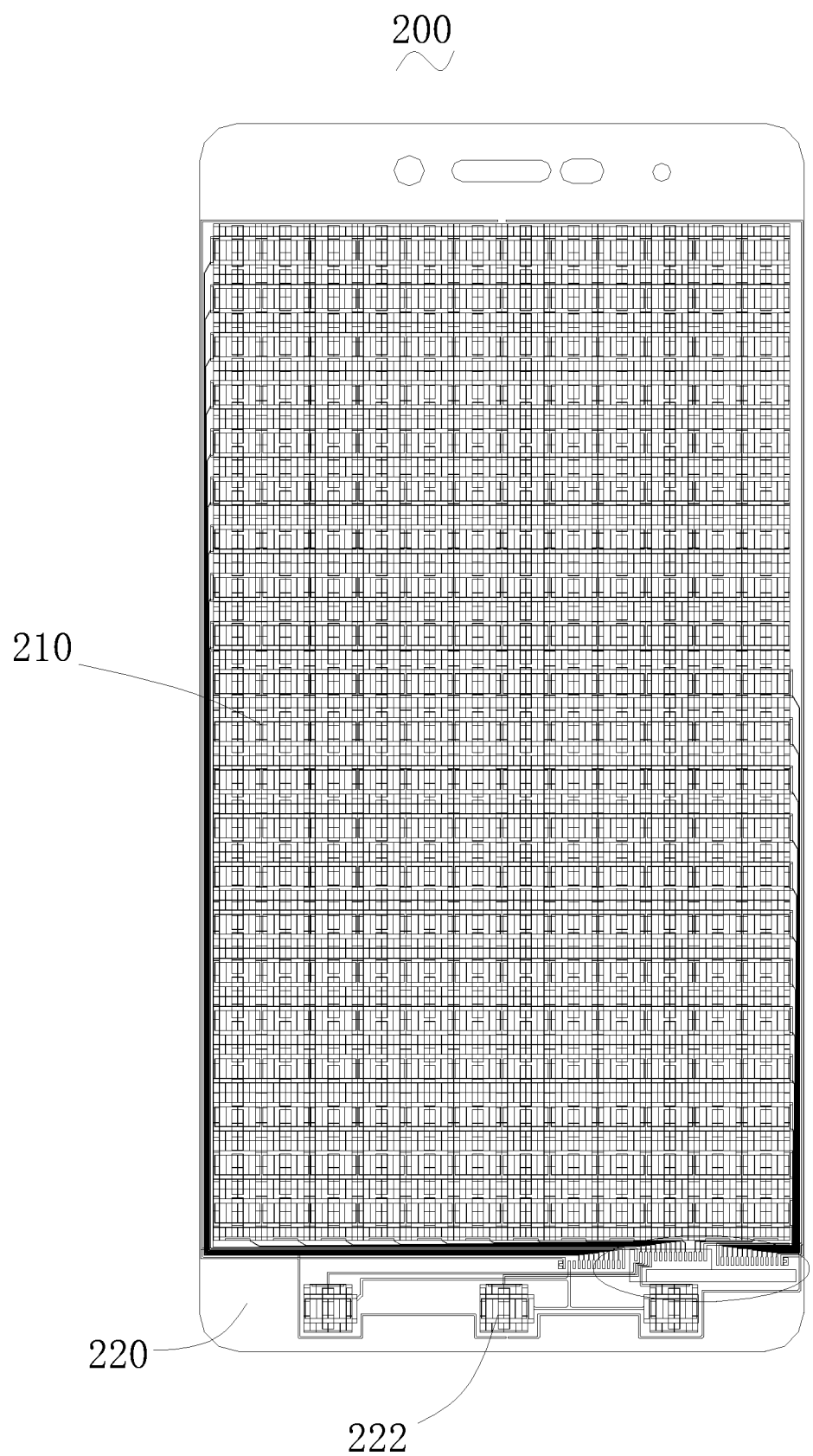
FIG. 3 is a schematic diagram illustrating a touch-sensitive conductive film according to the present disclosure.
Figure 4:
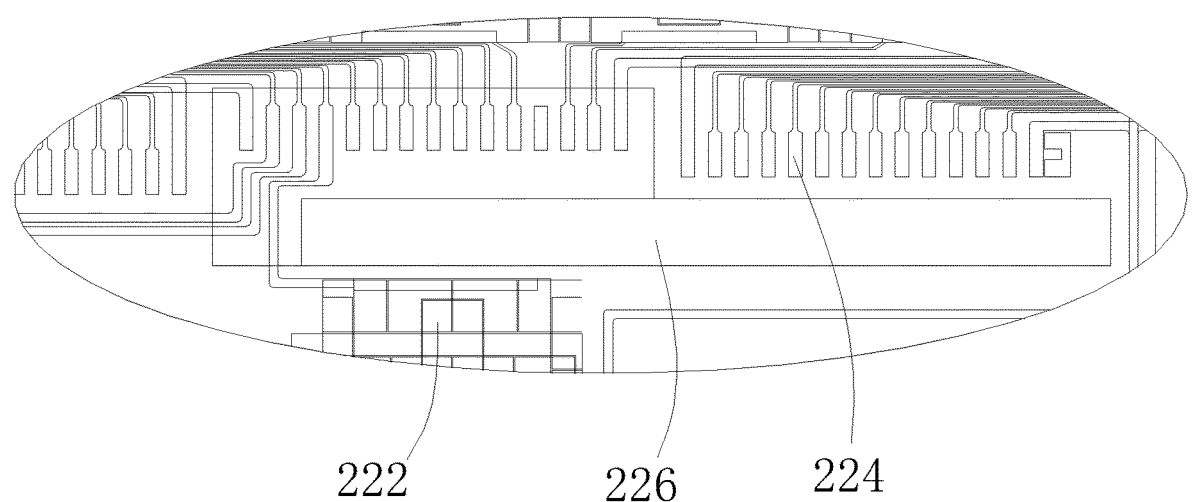
FIG. 4 is an enlarged view of a part of FIG. 3.

Referring to FIGS. 3 and 4, the present disclosure provides a touch-sensitive conductive film 200, which may be assembled to form a touch-sensitive screen. The touch-sensitive screen may be further attached together with a display screen (for example, a liquid crystal display screen), then applied to an electronic device (for example, a mobile phone).

The touch-sensitive conductive film 200 may be made of indium tin oxide (ITO). The touch-sensitive conductive film 200 may include a sensing area 210 and a key area 220.

Figure 5:
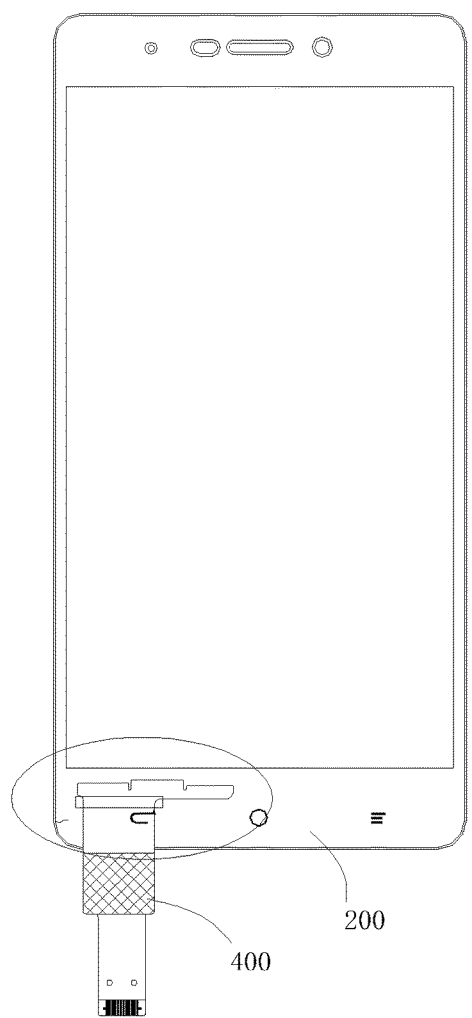
FIG. 5 is a schematic diagram illustrating a touch-sensitive conductive film after being attached to a protective cover board according to the present disclosure.
Figure 6:
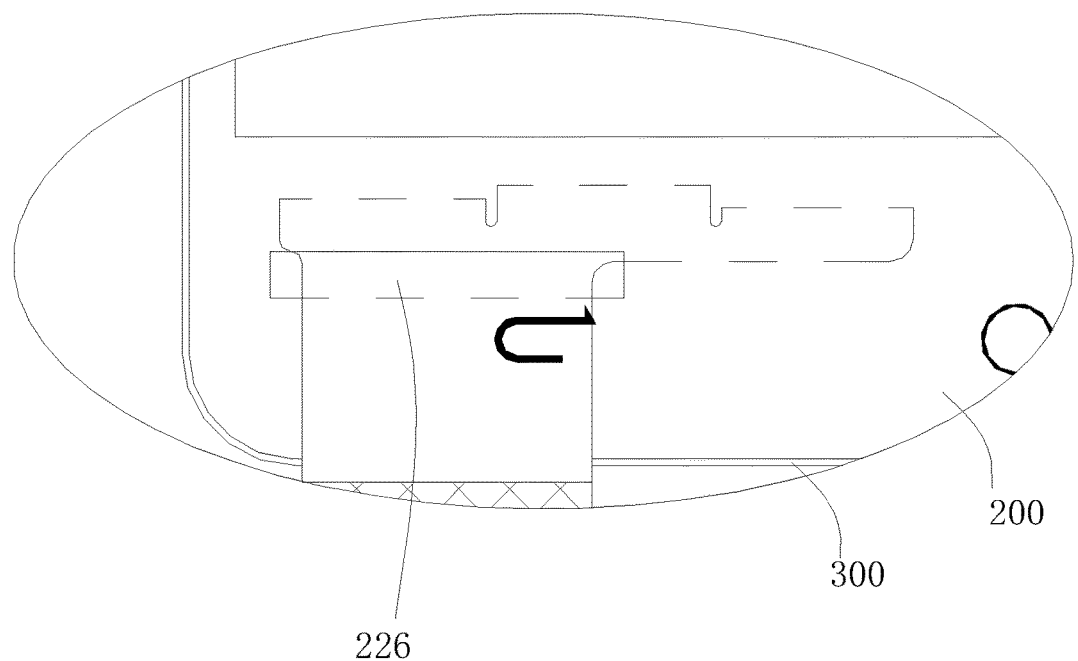
FIG. 6 is an enlarged view of a part of FIG. 5.
Figure 7:
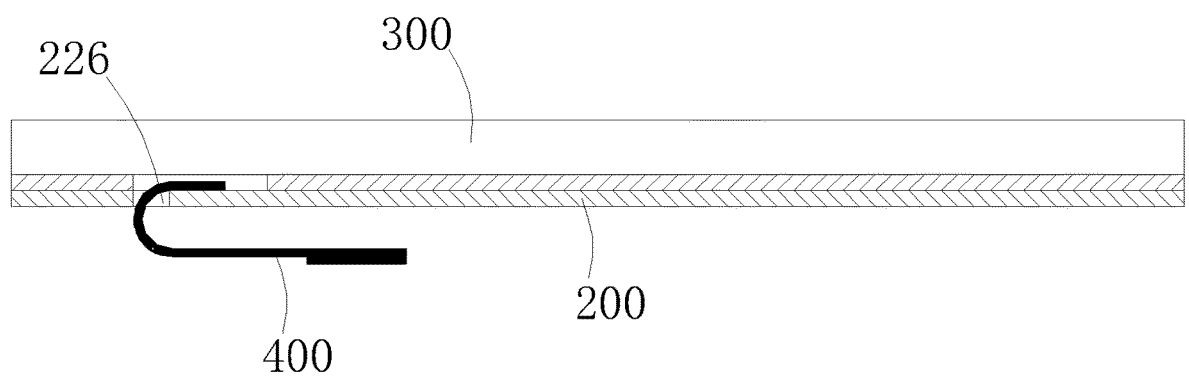
FIG. 7 is a sectional diagram illustrating a touch-sensitive conductive film after being attached to a protective cover board according to the present disclosure.

A touch circuit may be arranged in the sensing area 210. Referring to FIG. 5 to FIG. 7, when the touch-sensitive conductive film 200 is applied to the touch-sensitive screen, a protective cover board 300 will be attached thereon. When a finger touches the protective cover board 300 during the use of the touch-sensitive screen, the touch circuit will generate a touch signal due to the capacitance change. The coordinate value of the touch point can be determined by the touch signal, so that the position of the touch point can be determined.

A key (or keys) 222 and a bonding area (or bonding areas) 224 may be arranged inside the key area 220. The key 222 and the touch circuit inside the sensing area 210 are coupled to the bonding area 224 through the leads respectively. When the touch-sensitive conductive film 200 is assembled onto the display screen or the electronic device, the touch-sensitive conductive film 200 may be bonded to a flexible circuit board 400 in the bonding area 224, so that the touch-sensitive conductive film 200 can be coupled to a control main board through the flexible circuit board 400.

Referring to FIG. 6 and FIG. 7, the key area 220 may be provided with a through-hole 226 in a thickness direction of the touch-sensitive conductive film 200. The through-hole 226 is located at a side of the bonding area 224. In this way, as shown in FIG. 7, after one end of the flexible circuit board 400, i.e., a bonding end, is coupled to the bonding area 224, the other end of the flexible circuit board 400 may pass through the touch-sensitive conductive film 200 via the through-hole 226, then may be bent and coupled to the control main board (not shown).

The function of the through-hole 226 may be only for the flexible circuit board 400 to pass through. Thus the through-hole 226 may be designed to have a relatively small size so that the layout of the key 222 may not be affected due to the arrangement of the through-hole 226. The width of the through-hole 226 may be roughly consistent with the thickness of the flexible circuit board 400. The length of the through-hole 226 may be designed to allow the flexible circuit board 400 to pass through. In the disclosure, the through-hole 226 may be provided between one of the keys and the bonding area 224. A peripheral edge of the through-hole 226 may not overlap with an edge of the touch-sensitive conductive film 200. It is to be understood by a person skilled in the art that the arrangement of the through-hole is not limited to this, and the through-hole may be arranged in any way as long as the through-hole does not occupy the area for arranging the key. In the traditional art, the size of the notch 130 is relatively large, so the arrangement of the key is seriously affected.

After the flexible circuit board 400 is coupled to the touch-sensitive conductive film 200 to form a touch-sensitive assembly, one end of the flexible circuit board 400 may be bonded to the bonding area 224, and the other end of the flexible circuit board 40 may pass through the through-hole 226 to the other side of the touch-sensitive conductive film 200 away from the bonding area 224. In this way, parts of the flexible circuit board 400 other than a bonding end may be located on a back side of the key 222, so there is no space interference therebetween.

In addition, the attachment between the touch-sensitive screen and the complete electronic device may generally adhered by using a cotton adhesive having a uniform thickness. In the disclosure, after the flexible circuit board 400 is coupled to the touch-sensitive conductive film 200, the location where the touch-sensitive conductive film 200 may be attached onto the electronic device is the back area of the key 222. This portion which is the location used for attaching may have no notch, with a good flat performance, so the sealing performance of the attaching between the touch-sensitive screen and the electronic device is relatively good, while in the traditional art, an attaching surface is not flat due to the notch 130.

Referring to FIGS. 5, 6 and 7, a touch-sensitive assembly is formed after coupling the flexible circuit board 400 to the touch-sensitive conductive film 200. A protective cover board 300 may be attached on the touch-sensitive conductive film 200 in use. At this time, the protective cover board 300 may be located on a side of the touch-sensitive conductive film 200 bonded to the flexible circuit board 400. In other words, the protective cover board 300 may cover the bonding area 224.

The protective cover board 300 is generally made of a transparent substrate (such as glass). The protective cover board 300 may include a visible area located at the center thereof and a non-visible area located at a periphery thereof. The non-visible area may be formed by providing a light-shielding material. After the protective cover board 300 is attached on the touch-sensitive conductive film 200, the sensing area 210 may be located on the visible area, and the key area 220 may be located on the non-visible area. In this way, a user can operate over the sensing area 210 according to the change of the content on the screen.

Referring to FIG. 7, the flexible circuit board 400 may be bent in a direction away from the key area 220, so as to facilitate the attaching of the touch-sensitive conductive film 200 and the complete device. The flexible circuit board 400 may be bent after the touch-sensitive conductive film 200 and the protective cover board 300 have been assembled, or before the touch-sensitive conductive film 200 is assembled onto the complete device by an assembler thereof.

Based on the touch-sensitive assembly connected in the above way, a touch-sensitive display screen is further provided in the present disclosure. The touch-sensitive display screen may include the above touch-sensitive screen and the display screen, wherein both of which are attached together. The visible area of the protective cover board 300, the sensing area 210 of the touch-sensitive conductive film 200 and the display area of the display screen are oppositely arranged. Since the attaching surface of the touch-sensitive conductive film 200 is relatively flat, the sealing performance of the attaching between the touch-sensitive conductive film 200 and the display screen is relatively good.

Further, an electronic device having the above touch-sensitive display screen is provided. The electronic device may be a mobile phone, a tablet computer or the like. The sealing performance of the attaching between the touch-sensitive assembly and the display screen of the electronic device is relatively good.

The assembly process of the electronic device is generally as follows. The touch-sensitive conductive film 200 may be prepared firstly, then may be bonded to the flexible circuit board 400, and then may be bonded to the protective cover board 300. Then the assembly of the touch-sensitive conductive film 200, the flexible circuit board 400 and the protective cover board 300 may be attached on the display screen.

Technical features of the above embodiments may be combined arbitrarily. For brief description, not all of the possible combinations of the technical features of the above embodiments are described, but it will be appreciated that these possible combinations belong to the scope of the present disclosure once there is no conflict between the technical features.

The above are embodiments of the disclosure described in detail, and should not be deemed as limitations to the scope of the present disclosure. It should be noted that variations and improvements will become apparent to those skilled in the art to which the present disclosure pertains without departing from its scope. Therefore, the scope of the present disclosure is defined by the appended claims.

What is claimed is:

1. A touch-sensitive conductive film, comprising:
   a sensing area; and
   a key area provided with a bonding area configured to bond a flexible circuit board and a key,
   wherein the key area is provided with a through-hole formed in and extending through the touch-sensitive conductive film in a thickness direction of the touch-sensitive conductive film, and the through-hole is located between the key and the bonding area so that the flexible circuit board is able to pass through the touch-sensitive conductive film via the through-hole.

2. The touch-sensitive conductive film of claim 1, wherein a peripheral edge of the through-hole does not overlap with an edge of the touch-sensitive conductive film, the flexible circuit board passing through the touch-sensitive conductive film via the through-hole and blocked by a protective cover board attached to the touch-sensitive conductive film.

3. The touch-sensitive conductive film of claim 1, wherein the touch-sensitive conductive film is an indium tin oxide conductive film.

4. A touch-sensitive assembly, comprising:
   the touch-sensitive conductive film of claim 1; and
   a flexible circuit board having opposite first and second ends,
   wherein the flexible circuit board passes through the through-hole, the first end of the flexible circuit board is bonded to the bonding area of the touch-sensitive conductive film, the second end is bonded to a side of the touch-sensitive conductive film away from the bonding area.

5. The touch-sensitive assembly of claim 4, further comprising a protective cover board attached to the touch-sensitive conductive film, and the protective cover board is located on a side of the touch-sensitive conductive film bonded with the flexible circuit board, the flexible circuit board passing through the touch-sensitive conductive film via the through-hole, with the first end thereof blocked by the protective cover board.

6. The touch-sensitive assembly of claim 4, wherein the protective cover board is provided with a visible area located at a center thereof and a non-visible area located at a periphery thereof, the sensing area is located on the visible area, and the key area is located on the non-visible area.

7. The touch-sensitive assembly of claim 4, wherein the flexible circuit board is bent in a direction away from the key area after passing through the through-hole.

8. The touch-sensitive assembly of claim 4, wherein a width of the through-hole is consistent with a thickness of the flexible circuit board.

9. A touch-sensitive display screen, comprising:
   a display screen; and
   the touch-sensitive assembly of claim 4,
   wherein the touch-sensitive conductive film of the touch-sensitive assembly is attached together with the display screen.

10. An electronic device, comprising the touch-sensitive display screen of claim 9.

* * * * *